(12) United States Patent
McCoy

(10) Patent No.: US 7,619,484 B2
(45) Date of Patent: Nov. 17, 2009

(54) OSCILLATOR PHASE MATCHING

(75) Inventor: Scott McCoy, Halfway, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 118 days.

(21) Appl. No.: 11/875,421

(22) Filed: Oct. 19, 2007

(65) Prior Publication Data

US 2009/0102566 A1    Apr. 23, 2009

(51) Int. Cl.
*H03B 1/00* (2006.01)

(52) U.S. Cl. .................. 331/49; 331/2; 331/18

(58) Field of Classification Search .................. 331/49, 331/2, 18
See application file for complete search history.

(56) References Cited

U.S. PATENT DOCUMENTS

| 5,235,292 A | * | 8/1993 | Endo et al. ............ 331/49 |
| 6,122,756 A | | 9/2000 | Baxter et al. |
| 2007/0075756 A1 | | 4/2007 | Metz |

* cited by examiner

*Primary Examiner*—Joseph Chang

(57) ABSTRACT

A system comprises a primary oscillator that provides a first signal having a first phase and a backup oscillator that provides a second signal having a second phase. The system also comprises trim logic coupled to the backup oscillator logic. Prior to failure of the primary oscillator, the trim logic adjusts the second phase to match the first phase. Upon failure of the primary oscillator, the second signal is used in lieu of the first signal.

13 Claims, 2 Drawing Sheets

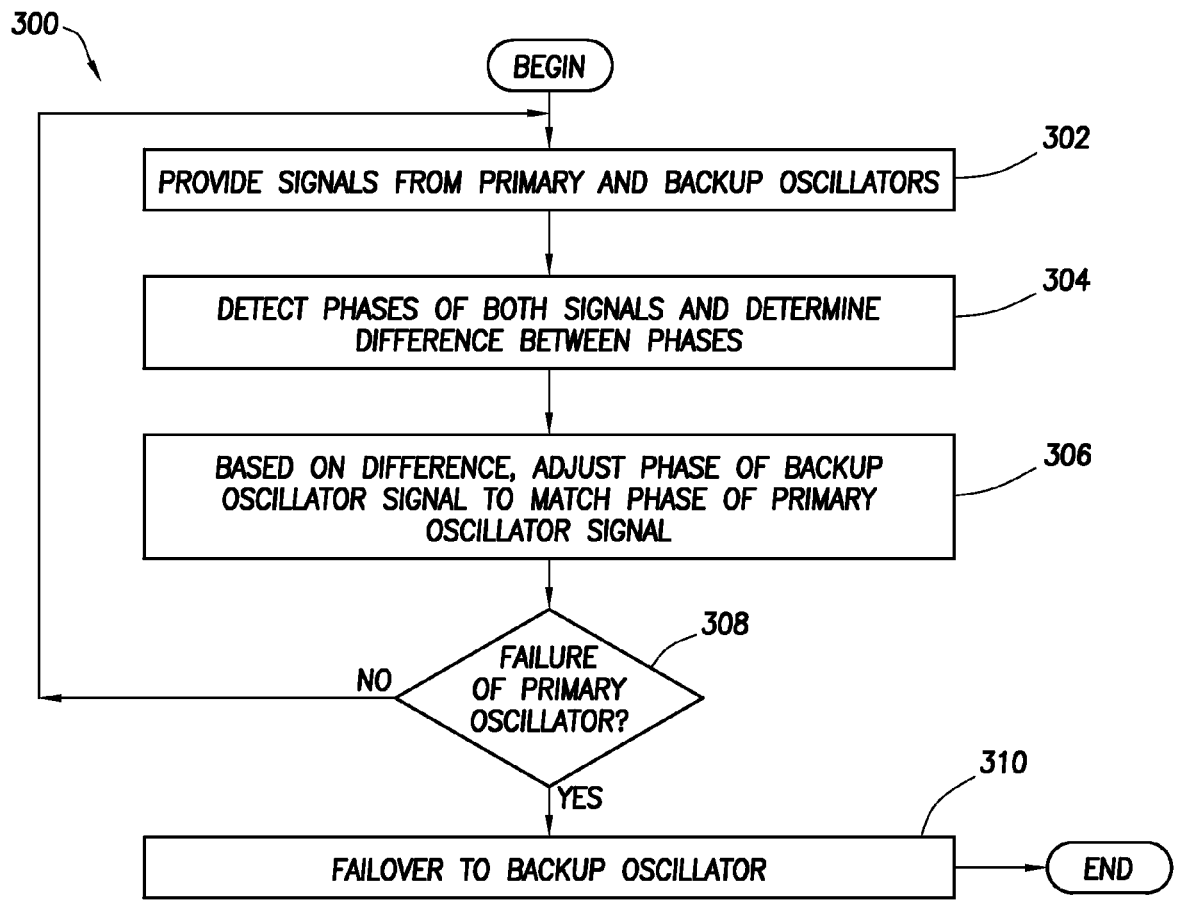

OSCILLATOR PHASE MATCHING

BACKGROUND

Various electronic devices implement hardware logic that is driven by one or more clocks. Problems may arise which cause the clock(s) to fail. To protect against such failure, many computer systems implement multiple clock signal sources (e.g., oscillators) in a "failover" configuration. In such a configuration, if a primary oscillator fails, a backup oscillator takes over the tasks of the primary oscillator. However, the oscillators are likely to be out of phase with each other. As a result, failing over from the primary oscillator to the backup oscillator may introduce signal glitches, runt pulses, etc. into the clock signal, thereby negatively affecting the overall performance of the electronic device within which the clock is implemented.

BRIEF DESCRIPTION OF THE DRAWINGS

For a detailed description of exemplary embodiments of the invention, reference will now be made to the accompanying drawings in which:

FIG. 2 shows a table of various trim logic state combinations associated with the clock circuit of FIG. 1, in accordance with various embodiments; and FIG. 3 shows a flow diagram of an illustrative method, in accordance with various embodiments.

NOTATION AND NOMENCLATURE

Figure 1:
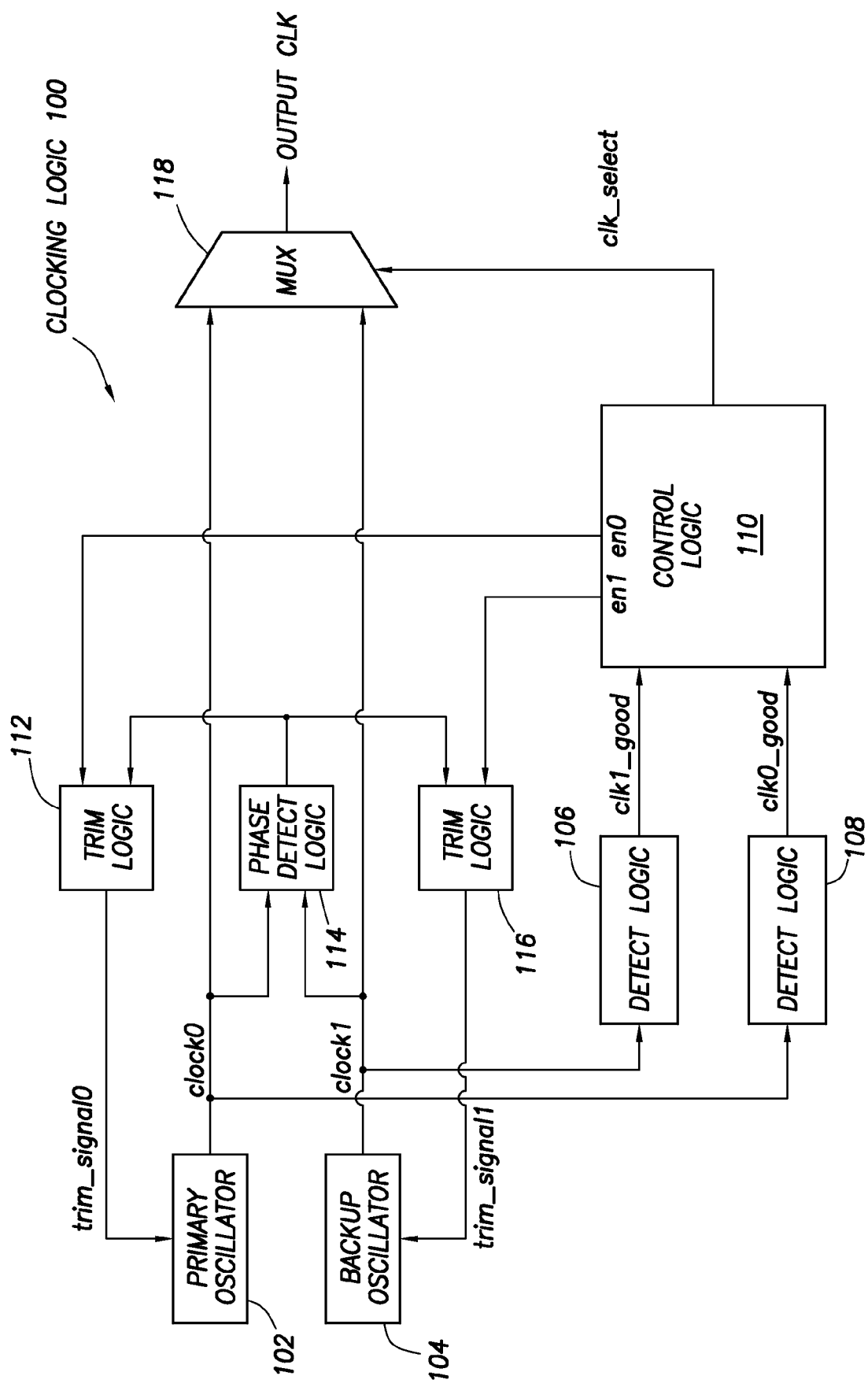
FIG. 1 shows a block diagram of an illustrative clock circuit, in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, in the following discussion and in the claims, the term "couple" or "couples" is intended to mean either an indirect, direct, optical or wireless electrical connection. Thus, if a first device couples to a second device, that connection may be through a direct electrical connection or through an indirect electrical connection via other devices and connections. Further, in the following discussion and in the claims, the term "match" is intended to mean "to make identical to," "to make substantially similar, but not identical, to," "to attempt to make identical to," or "to attempt to make substantially similar, but not identical, to." Further still, the term "or" is to be interpreted in an inclusive sense rather than in an exclusive sense.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein are various embodiments of a technique that mitigates problems that occur as a result of switching between oscillator signals having mismatched phases. Specifically, the technique comprises repeatedly adjusting (or "trimming") the phase of a backup oscillator signal to match the phase of a primary oscillator signal. In this way, if the primary oscillator fails, the backup oscillator will be able to "take over" for the primary oscillator without problems associated with a change in signal phase.

FIG. 1 shows a block diagram of an illustrative clocking logic 100, in accordance with various embodiments. The clocking logic 100 comprises a primary oscillator 102, a backup oscillator 104, a detect logic 106, another detect logic 108, control logic 110, trim logic 112, phase detection logic 114, another trim logic 116 and a multiplexer (MUX) 118. Both the oscillators 102 and 104 output clock signals CLOCK0 and CLOCK1 of substantially similar frequency. The signals output by the oscillators 102 and 104 are provided to the MUX 118. The signal output by the primary oscillator 102 also is provided to the detect logic 108, while the signal output by the backup oscillator 104 is provided to the detect logic 106.

The detect logic 106 monitors the backup oscillator 104 to determine whether the backup oscillator 104 outputs a proper signal. Based on its determination, the detect logic 106 provides either a "HIGH" or a "LOW" signal (CLK1_GOOD) to the control logic 110. For example, in some embodiments, if the detect logic 106 determines that a proper signal is being output by the backup oscillator 104, the detect logic 106 outputs a "HIGH" signal to the control logic 110. If the detect logic 106 determines that a proper signal is not being output by the backup oscillator 104, the detect logic 106 outputs a "LOW" signal to the control logic 110. Similarly, the detect logic 108 monitors the primary oscillator 102 to determine whether the primary oscillator 102 outputs a proper signal. Based on this determination, the detect logic 108 provides the control logic 110 with either a "HIGH" or a "LOW" signal (CLK0_GOOD). The detect logic 106 and 108 may use any suitable test to determine whether the oscillators are providing proper signals, such as a minimum amplitude test or a frequency range test.

Based on the signals received from the detect logic 106 and 108, the control logic 110 outputs a CLK_SELECT control signal to the MUX 118. The CLK_SELECT signal causes the MUX 118 to output either the clock signal from the primary oscillator 102 or the clock signal from the backup oscillator 104. Thus, as long as the detect logic 108 indicates that the primary oscillator 102 is functioning properly, the control logic 110 causes the MUX 118 to output only the clock signal from the primary oscillator 102. However, if the detect logic 108 indicates to the control logic 110 that the primary oscillator 102 is not functioning properly, and if the detect logic 106 indicates to the control logic 110 that the backup oscillator 104 is functioning properly, the control logic 110 causes the MUX 118 to output only the clock signal from the backup oscillator 102. This process of switching the MUX output from the primary oscillator signal to the backup oscillator signal is known as "failover."

It is desirable for the signals output by the oscillators 102 and 104 to be phase-matched so that, when a failover occurs, no glitches or other problems (e.g., large phase discontinuities and resulting loss of phase lock in subsequent, downstream PLLs) occur as a result of mismatched phases between the different oscillator signals. Accordingly, the phase detection logic 114, the trim logic 112 and the trim logic 116 ensure that the signals output by the oscillators 102 and 104 are phase-matched. The phase detection logic 114 receives the output clock signal of the primary oscillator 102 and the output clock signal of the backup oscillator 104. The phase detection logic 114 then determines the difference between the phases of the two signals. The phase detection logic 114 generates one or more signals (analog or digital) that are proportional to this difference. In turn, the trim logic 112 or the trim logic 116 receives one or more signals indicative of this difference determination from the phase detection logic 114 and, based on this difference, adjusts (or "trims") the phase of the associated oscillator signal to match the phase of the other oscillator's signal. To this end, the trim logic 112 generates an adjustment signal TRIM_SIGNAL0 that it provides to the primary oscillator 102. Similarly, the trim logic 116 generates an adjustment signal TRIM_SIGNAL1 that it provides to the backup oscillator 104.

In at least some embodiments, only one of the trim logic 112 or 116 adjusts its oscillator signal phase at a time. Stated otherwise, one trim logic is enabled and the other trim logic is disabled. Whether a particular trim logic is enabled or disabled depends on the control logic 110. The control logic 110 uses information received from the detect logic 106 and 108 to enable or disable each of the trim logic 112 and 116.

FIG. 2 shows a table 200 describing the various trim logic states implemented in at least some embodiments. Referring to table 200, when the primary oscillator 102 and the backup oscillator 104 are both enabled (i.e., functioning properly), the trim logic 116 is enabled and the trim logic 112 is disabled (block 202). When the primary oscillator 102 is enabled and the backup oscillator 104 is disabled, the trim logic 112 is disabled and the state of the trim logic 116 is irrelevant (because the backup oscillator 104 is disabled due to failure or intentional shut-off to save power) (block 204). When the primary oscillator 102 is disabled and the backup oscillator 104 is enabled, the trim logic 116 is disabled and the state of the trim logic 112 is irrelevant (block 206). When both the primary oscillator 102 and backup oscillator 104 are disabled, the states of both the trim logic 116 and the trim logic 112 are irrelevant (block 208). Generally, it is desirable that only one trim logic 112, 116 be enabled at a time, since enabling both at the same time would undesirably result in both the oscillators 102 and 104 being adjusted indefinitely, thereby causing system instability. Regardless, multiple trim logic are provided so that in at least some implementations, the oscillator 104 may be designated as the primary oscillator and the oscillator 102 may be designated as the backup oscillator. Multiple trim logic are also provided so that a failed primary oscillator may be replaced with a functioning oscillator that is subsequently designated as the backup oscillator.

By adjusting the phase of the backup oscillator signal to match the phase of the primary oscillator signal (or vice versa) as explained above, seamless transitions between oscillators are possible when a failover event occurs. FIG. 3 shows a flow diagram of a method 300 implemented in accordance with various embodiments. The method 300 begins by providing signals from primary and backup oscillators (block 302). The method 300 also comprises detecting phases of both signals and determining a difference between the phases (block 304). The method 300 further comprises, based on the difference, adjusting the phase of the backup oscillator signal to match the phase of the primary oscillator signal (block 306). If the primary oscillator fails (block 308), a seamless failover from the primary oscillator to the secondary oscillator occurs (block 310). Otherwise, the method 300 continues at block 302.

The embodiments presented above may appear to have been described in the context of the permanent disablement of one of the oscillators, resulting in a permanent failover to the remaining oscillator. However, in some situations, a disabled (e.g., failed or manually shut-off) oscillator may become enabled again. In some embodiments, if a disabled oscillator is enabled again, a failover is performed to the re-enabled oscillator. The failover may be performed immediately, upon failure of the other oscillator, or at some other predetermined time. For example, the primary oscillator 102 may become disabled and, as a result, a failover to the backup oscillator 104 may be performed. If, however, the primary oscillator 102 is re-enabled, failover may be performed from the backup oscillator 104 to the primary oscillator 102. This failover may be performed immediately upon re-enablement of the primary oscillator 102, upon failure of the backup oscillator 104, or at some other predetermined time.

The techniques described above may be implemented in any suitable device or system. For example, the techniques may be implemented in computers (e.g., desktop computers, laptop computers, server computers), printers, digital music devices, mobile communication devices (e.g., cell phones, personal digital assistants), and any other electronic device that uses a clock.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
 a primary oscillator providing a first signal having a first phase;
 a backup oscillator providing a second signal having a second phase; and
 trim logic coupled to the backup oscillator;
 wherein, prior to failure of the primary oscillator, the trim logic adjusts the second phase to match the first phase;
 wherein, upon failure of the primary oscillator, the second signal is used in lieu of the first signal.

2. The system of claim 1, wherein the system comprises an electronic device selected from a group consisting of a computer, a printer, a mobile communication device and a digital music device.

3. The system of claim 1 further comprising second trim logic coupled to the primary oscillator, wherein the second trim logic is adapted to repeatedly adjust the first phase to match the second phase prior to failure of the backup oscillator.

4. The system of claim 1 further comprising phase detection logic coupled to both the primary oscillator and the backup oscillator; wherein the phase detection logic determines a difference between the first and second phases and provides a signal indicative of said difference to said trim logic.

5. The system of claim 1 further comprising a detect logic coupled to the primary oscillator logic and a control logic coupled to the detect logic;
 wherein, if the detect logic determines that the primary oscillator logic is non-functional, the control logic disables the trim logic;
 wherein, if the detect logic determines that the primary oscillator logic is functional, the control logic enables the trim logic.

6. A system, comprising:
- a first oscillator that produces a first signal having a first phase;
- a second oscillator that produces a second signal having a second phase;
- a phase detector coupled to the first and second oscillators, the phase detector configured to determine a difference between the first and second phases; and
- trim logic coupled to the first and second oscillators;
- wherein, based on the difference, a control logic is configured to cause the trim logic to adjust the first phase or the second phase.

7. The system of claim 6, wherein the control logic causes the trim logic to adjust the first phase and prevents the trim logic from adjusting the second phase.

8. The system of claim 6, wherein the system comprises a device selected from the group consisting of a computer, a mobile communication device, a printer and a digital music device.

9. The system of claim 6 further comprising a first detect logic coupled to the first oscillator and a second detect logic coupled to the second oscillator; wherein, if the first detect logic determines that the first oscillator has failed, the control logic causes the trim logic to cease adjusting the second phase and causes a multiplexer to enable a signal from the second oscillator to pass through the multiplexer.

10. A method, comprising:
- providing a primary oscillator signal and a backup oscillator signal;
- determining a difference between phases of said signals; and
- based on said difference, adjusting a phase of the backup oscillator signal to match another phase of the primary oscillator signal;
- wherein, if the primary oscillator fails, failing over from the primary oscillator signal to the backup oscillator signal.

11. The method of claim 10, wherein providing the primary oscillator signal comprises using a primary oscillator housed within a device selected from the group consisting of a personal computer, a printer, a server, a digital music device and a mobile communication device.

12. The method of claim 10 further comprising, if the primary oscillator fails, ceasing to adjust said phase of the backup oscillator signal.

13. The method of claim 10, wherein adjusting the phase comprises adjusting the phase prior to failure of the primary oscillator.

* * * * *